United States Patent
Hedman

(10) Patent No.: US 8,305,100 B2
(45) Date of Patent: Nov. 6, 2012

(54) DIAGNOSING AN ELECTRONIC SENSOR

(75) Inventor: Risto Hedman, Lappeenranta (FI)

(73) Assignee: Risto Hedman, Lappeenranta (FI)

( * ) Notice: Subject to any disclaimer, the term of this patent is extended or adjusted under 35 U.S.C. 154(b) by 121 days.

(21) Appl. No.: 12/531,536

(22) PCT Filed: Feb. 22, 2008

(86) PCT No.: PCT/FI2008/050082
§ 371 (c)(1),
(2), (4) Date: Mar. 11, 2010

(87) PCT Pub. No.: WO2008/113883
PCT Pub. Date: Sep. 25, 2008

(65) Prior Publication Data
US 2010/0164511 A1  Jul. 1, 2010

(30) Foreign Application Priority Data

Mar. 16, 2007 (FI) ..................................... 20070216

(51) Int. Cl.
*G01R 31/302* (2006.01)
(52) U.S. Cl. ............... 324/754.21; 324/750.23; 324/601
(58) Field of Classification Search .................. 324/601, 324/750.23, 754.21
See application file for complete search history.

(56) References Cited

U.S. PATENT DOCUMENTS

| 5,990,484 A | * | 11/1999 | Ohsuka ...................... 250/458.1 |
| 6,040,779 A | * | 3/2000 | Pfaff et al. ..................... 340/661 |
| 7,304,484 B2 | * | 12/2007 | Braun et al. ................... 324/670 |
| 2007/0115005 A1 | * | 5/2007 | Shimizu et al. ............... 324/549 |
| 2007/0177162 A1 | * | 8/2007 | Glueck ......................... 356/621 |

FOREIGN PATENT DOCUMENTS

| EP | 1191343 A2 | 3/2002 |
| EP | 1666862 A2 | 6/2006 |
| GB | 2334588 A | 8/1999 |

* cited by examiner

*Primary Examiner* — Arleen M Vazquez
(74) *Attorney, Agent, or Firm* — Fay Sharpe LLP

(57) ABSTRACT

The apparatus (1) for checking the operational condition of an electronic sensor element (3) which measures a physical quantity comprises testing means for providing a test deflection, corresponding to a specific change in the measured physical quantity, in the measurement signal produced by the sensor element and by a measuring circuit (2) connected thereto. According to the invention, the testing means comprise a testing circuit (4) which is galvanically separated from the measuring circuit and includes a light source (5a, 5b), and a light-sensitive component (6a, 6b) connected to the measuring circuit for receiving a light signal (7a, 7b) emitted by the light source and for further providing in the measurement signal a test deflection proportional to the light signal.

5 Claims, 1 Drawing Sheet

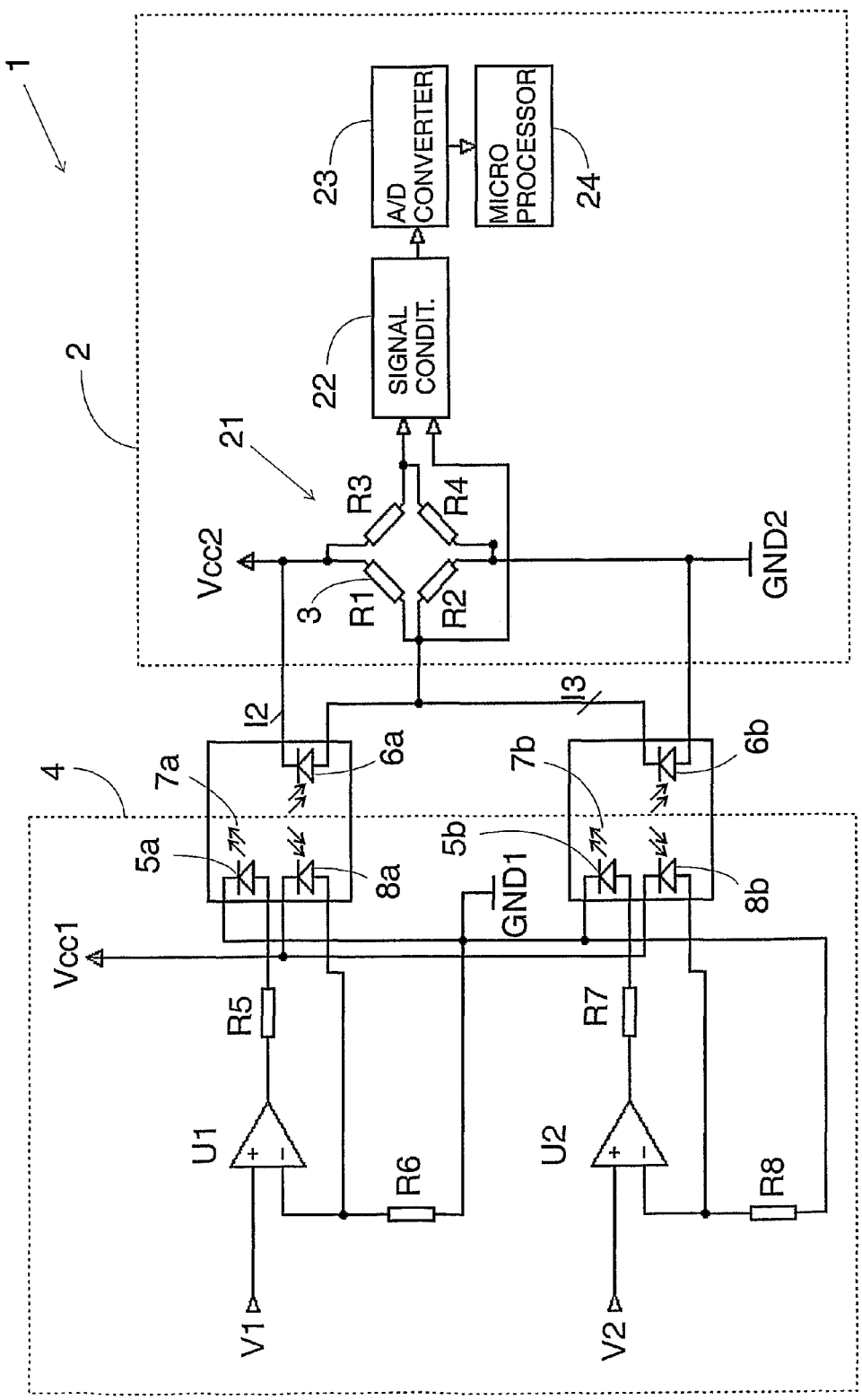

DIAGNOSING AN ELECTRONIC SENSOR

FIELD OF THE INVENTION

The invention relates to checking the operational condition of electronic sensors which measure physical quantities.

BACKGROUND OF THE INVENTION

Sensors which convert physical quantities into electrical variables, such as changes in the current or resistance, are used in various applications, from the simple thermometer replacing the liquid-filled one to the measuring devices used for controlling complex industrial processes. The more critical the proper and reliable functioning of the sensor element, the more important it is to be able to also control its operational condition, as well as the operational condition of the associated signal processing chain, and to obtain information about the potential malfunction, so that incorrect conclusions will not be made based on inaccurate measurement results due to malfunctioning of the sensor.

Most often, the small sensor elements are integral parts of the electronics, so it is not possible to remove them for testing. Therefore the operational condition should be verifiable without having to interfere with the actual sensor element.

Known solutions for checking the operational condition comprise, firstly, the use of more than one sensor elements for the same measurement, and comparison of the measurement results obtained from these sensors. Large or altered differences between the sensor elements indicate malfunction. Another known solution is to artificially arrange in the sensor a deflection which corresponds to a specific change of the physical quantity, such that the possible changes in the operation of the sensor element can be detected by comparing the deflection generated at the time of testing to the corresponding deflection generated at the time of installing the sensor. In practice, for example in the Wheatstone bridge connection, the testing deflection can be provided manually with a coupler that couples an additional resistance in parallel with one of the resistors.

Problems of the known solutions include complexity and consequently high expenses, manual operation and interference produced in the measurement signal by the additional components that are connected to the measuring circuit for testing. The objective of the invention is to alleviate these problems.

SUMMARY OF THE INVENTION

The apparatus and method according to the invention are characterized by what has been presented respectively in claims 1 and 6.

Firstly, the invention relates to an apparatus for checking the operational condition of an electronic sensor element which measures a physical quantity, comprising testing means for providing an artificial test deflection, corresponding to a specific change of the measured quantity, in the measurement signal produced by the sensor element and by the measuring circuit connected thereto. The electronic sensor element refers to a component which detects any physical quantity and converts, together with the measuring circuit connected to the sensor element, that quantity into an electrical signal. The deflection corresponding to a specific change in the measured quantity may be, depending on the measuring connection, an increase in the signal, corresponding to a specific absolute change in the quantity, or a relative change in the signal, proportional to the signal level which was dominant before generating the deflection.

According to the invention, the apparatus comprises a testing circuit, galvanically separate from the measuring circuit and comprising a light source, and a light-sensitive component connected to the measuring circuit for receiving the light signal emitted by the light source and further for providing in the measurement signal a test deflection proportional to the light signal. One fundamental principle of the invention therefore comprises generating the test deflection of the measurement signal, required for testing the operational condition of the sensor element, by means of light by emitting a light signal of a specific intensity to the light-sensitive component connected to the measuring circuit, for example to a photo diode or a phototransistor.

In practice, the light source and the light-sensitive component may form one integrated component. Such components, often referred to as optocouplers, are generally available in various types. The light source is normally an LED and the light-sensitive component is either a photo diode or a phototransistor in which the light produces a current through the component. The component or components for the production and reception of the light signal can be integrated with the rest of the measuring electronics and are easily controlled for example by means of a programme in a computer connected to the measuring electronics.

In addition to the possibility of automatic control, another substantial advantage of the invention is the lack of galvanic connection between the test circuit and the actual measuring circuit. In this manner, the testing control circuit interferes as little as possible with the operation of the measuring circuit, which manifests itself in a good signal-to-noise ratio. In this type of arrangement, the test deflection control circuit does not cause distortion in the measurement signal when the test deflection is not being produced.

In a preferred embodiment of the invention, the light-sensitive component is arranged to produce a current signal which is proportional to the light signal, for providing the test deflection in the measuring circuit. The actual measurement signal which is measured and processed further is typically the voltage over one of the resistors in the measuring circuit, in which case the test current signal which is summed to the measuring current that is proportional to the actual measured physical quantity is a straightforward manner of providing said test deflection.

The sensor element may be for example a resistor-type sensor, in which case the measured physical quantity affects the sensor resistance and thereby the current through the sensor. On the other hand, the sensor element may also be for example a current-type sensor which practically serves as a current supply, proportional to the physical quantity. In both cases, the actual measurement signal is typically the voltage over some of the resistors in the measuring circuit, in which case the afore-mentioned current signal produced by the light-sensitive component is an advantageous manner of providing the test deflection.

In one embodiment of the invention, the measuring circuit comprises a Wheatstone bridge connection in which the sensor element is one of the resistors in the bridge connection. As one of the four resistors of the bridge is a resistor-type sensor, the bridge resistors are typically adjusted so that in a certain situation the bridge is balanced, producing zero voltage between the bridge arms. As the measured quantity causes a change in the measured resistor, the balance is broken, which manifests itself in said voltage between the bridge arms. In order to test the operational condition of the sensor, the bridge can also be artificially deflected by feeding a current signal converted from the light signal to the measuring arm. In this case, the additional resistors according to the prior art which are connected separately to the bridge are not required. It is of course possible that more than one of the bridge resistors constitute a sensor element which measures some physical quantity.

To maintain the light signal used in the actual testing as constant as possible, the testing circuit preferably comprises means for compensating the aging of the light source.

The method of the invention for checking the operational condition of an electronic sensor element comprises producing an artificial test deflection, corresponding to a specific change in a measured quantity, in the measurement signal produced by the sensor element and by the measuring circuit connected thereto. According to the invention, the test deflection is produced by emitting a light signal into the measuring circuit from outside the measuring circuit, the light signal being further convertible into a more suitable signal and summed to the measurement signal. Emission from outside the measuring circuit refers to a lack of galvanic connection between the light signal emitting and receiving means.

The light signal emitted to the measuring circuit in order to provide the test deflection is preferably converted into a current signal in the measuring circuit.

To maintain the testing reliable, the changes in the light signal produced by aging of the means used for emitting the light signal are preferably compensated in the method.

DETAILED DESCRIPTION OF THE INVENTION

In the following section, the invention will be described in more detail with the aid of the accompanying drawing, in which FIG. 1 is a connection diagram of one apparatus according to the invention, illustrating at the same time one method according to the invention.

The apparatus 1 of FIG. 1 comprises a measuring circuit 2, including a Wheatstone bridge connection 21, signal processing electronics 22, an A/D converter 23 and a microprocessor 24. One of the bridge resistors is a resistor-type sensor element 3 in which the resistance depends on the measured quantity which may be for example the temperature. The sensor element may also be for example a strain gauge which measures the bending and strain of an object. For testing the operational condition of the sensor element, the apparatus also comprises, in addition to the actual measuring circuit, a testing circuit 4 for producing a test deflection in the measuring circuit and the measurement signal. The testing circuit 4 comprises two parts, each including an LED 5a, 5b controlled by control voltage V1, V2 by means of an operation amplifier U1, U2, and resistors R5, R6, R7, R8, for emitting a light signal 7a, 7b. Respectively, for receiving the light signals there are photo diodes 6a, 6b connected to the measuring circuit. One of the photo diodes is connected in parallel with the measuring sensor element 3 and the other one in parallel with the second resistor R2 of the same arm in the bridge. In practice, the photo diodes and LEDs may be components integrated in pairs. Instead of a photo diode, it is naturally possible to use for example a phototransistor.

In normal operation, the bridge connection 21 is so adjusted that the bridge is balanced at a specific value of the measured quantity, in which case the voltage measured between the bridge arms is zero. To realize the adjustment, it is possible to adjust the resistance of some of the bridge resistors R2, R3, R4. When the measured quantity changes from this basic situation, it causes the bridge balance to be broken and produces a voltage between the bridge arms. When one wishes to test the operational condition of the sensor, it is possible to emit a light signal 7a, 7b of a particular intensity with the light source 5a, 5b of the testing circuit, the light signal producing a current through the transistor 6a, 6b. Depending on which part of the testing circuit 4 is used for emitting the light signal, the light signal 7a, 7b produces in the phototransistor 6a, 6b a current 12, 13 which is summed to the current passing through either the sensor element 3 or the second resistor R2 of the measuring arm, producing in the voltage between the bridge arms a deflection which is either positive of negative, depending on the applied part of the testing circuit. The intensity of the light signal used for testing the sensor is predetermined to correspond to the deflection of a specific intensity in the case of a properly functioning sensor element. If the deflection produced in the measuring voltage in the testing differs substantially from the reference deflection, it indicates malfunction of the sensor element. As the test deflection is generated in the measurement signal by means of light, the galvanic connection between the testing circuit 4 and the measuring circuit 2 becomes unnecessary, so that the testing circuit provides as little interference or distortion as possible in the actual measurement.

By the above-described principal, i.e. by producing a test deflection of a specific intensity in the measurement signal, the apparatus of FIG. 1 can also be used for examining the operational condition of the entire signal processing path 22, 23, 24. Also, besides checking the operational condition of the sensor or the entire signal processing path, the apparatus can be used for balancing the bridge connection by means of a suitable DC bottom level of the light signal 7a, 7b. This simplifies the entire apparatus, because separate means, for example adjustable resistors, for balancing the bridge are not required.

The testing circuit 4 of FIG. 1 also comprises photo diodes 8a, 8b for both light sources 6a, 6b in the actual testing circuit. These photo diodes are designed for compensating the aging of the LEDs. They can be used for monitoring the possible changes in the light signals, effected by the aging of the LEDs, and for compensating these changes by causing changes in the control voltages V1, V2.

The invention is not limited merely to the examples referred to above; instead it is obvious to a person skilled in the art that many variations are possible within the scope of the claims. In particular, the measuring connection may be any connection in addition to the Wheatstone bridge connection.

The invention claimed is:
1. An apparatus for checking the operational condition of an electronic sensor element which measures a physical quantity, comprising testing means for providing a test deflection, corresponding to a specific change in the measured physical quantity, in the measurement signal produced by the sensor element and by a measuring circuit connected thereto, characterized in that the testing means comprise a testing circuit which is galvanically separated from the measuring circuit and includes a light source and a light-sensitive component connected to the measuring circuit for receiving a light signal emitted by the light source and for further providing in the measurement signal a test deflection proportional to the light signal.

2. The apparatus according to claim 1, characterized in that the light-sensitive component is arranged to produce a current signal in the measuring circuit for providing the test deflection.

3. The apparatus according to claim 1, characterized in that the sensor element is a resistor-type sensor.

4. The apparatus according to claim 1, characterized in that the measuring circuit comprises a Wheatstone bridge connection in which the sensor element is one of the resistors of the bridge connection.

5. The apparatus according to claim 1, characterized in that the testing circuit comprises means for compensating the changes effected in the light signal by aging of the light source.

* * * * *